United States Patent
Qi et al.

(10) Patent No.: US 10,416,214 B2
(45) Date of Patent: Sep. 17, 2019

(54) SYSTEM FOR TESTING WIRELESS TERMINAL AND METHOD FOR CONTROLLING THE SAME

(71) Applicant: GENERAL TEST SYSTEMS INC., Shenzhen (CN)

(72) Inventors: Yihong Qi, Shenzhen (CN); Wei Yu, Shenzhen (CN)

(73) Assignee: GENERAL TEST SYSTEMS INC., Shenzhen (CN)

( * ) Notice: Subject to any disclaimer, the term of this patent is extended or adjusted under 35 U.S.C. 154(b) by 99 days.

(21) Appl. No.: 15/565,282

(22) PCT Filed: Mar. 24, 2016

(86) PCT No.: PCT/CN2016/077236
§ 371 (c)(1),
(2) Date: Oct. 9, 2017

(87) PCT Pub. No.: WO2016/161897
PCT Pub. Date: Oct. 13, 2016

(65) Prior Publication Data
US 2018/0172747 A1   Jun. 21, 2018

(30) Foreign Application Priority Data
Apr. 10, 2015   (CN) .......................... 2015 1 0167640

(51) Int. Cl.
*G01R 29/10*   (2006.01)
*H04B 17/00*   (2015.01)
*G01R 29/08*   (2006.01)

(52) U.S. Cl.
CPC ......... *G01R 29/0871* (2013.01); *G01R 29/08* (2013.01); *G01R 29/0821* (2013.01); *G01R 29/105* (2013.01)

(58) Field of Classification Search
CPC ...... G01R 29/08; G01R 29/10; G01R 29/105; G01R 29/0821; G01R 29/0871; H01Q 15/14; H01Q 15/141; H01Q 17/00
See application file for complete search history.

(56) References Cited

U.S. PATENT DOCUMENTS

| | | | | |
|---|---|---|---|---|
| 4,218,683 A | * | 8/1980 | Hemming | G01R 29/105 |
| | | | | 342/4 |
| 4,931,798 A | | 6/1990 | Kogo | |

(Continued)

FOREIGN PATENT DOCUMENTS

| | | |
|---|---|---|
| CN | 101802625 A | 8/2010 |
| CN | 102016608 A | 4/2011 |

OTHER PUBLICATIONS

ISA/CN, International Search Report and Written Opinion for PCT/CN2016/077236 dated May 27, 2016.

(Continued)

*Primary Examiner* — Minh N Tang
(74) *Attorney, Agent, or Firm* — Hodgson Russ LLP

(57) ABSTRACT

Disclosed are a system for testing a wireless terminal and a method for controlling the same. The system includes: a reflecting surface, configured to totally reflect one or more first wireless signals emitted by the wireless terminal; a test antenna, configured to receive the one or more first wireless signals reflected by the reflecting surface; and an absorbing screen, configured to absorb one or more second wireless signals emitted by the wireless terminal. The device under test, the test antenna and the reflecting surface correspond to a same ellipsoid, the device under test and the test antenna are arranged at two foci of the ellipsoid respectively, the reflecting surface is arranged on the ellipsoidal surface and the absorbing screen is arranged on a straight line between the device under test and the test antenna.

16 Claims, 4 Drawing Sheets

(56) References Cited

U.S. PATENT DOCUMENTS

| | | | | |
|---|---|---|---|---|
| 8,275,738 B2* | 9/2012 | Gross | .................. | G01R 31/308 |
| | | | | 706/62 |
| 8,279,104 B2* | 10/2012 | Hirata | ................ | G01R 29/0878 |
| | | | | 342/1 |
| 8,643,553 B2* | 2/2014 | Teshirogi | ............... | G01R 29/10 |
| | | | | 343/703 |
| 9,964,577 B2* | 5/2018 | Qi | ......................... | G01R 29/10 |
| 10,012,683 B2* | 7/2018 | Qi | ......................... | G01R 29/08 |
| 2014/0327586 A1 | 11/2014 | Huff | | |

OTHER PUBLICATIONS

The State Intellectual Property Office of People's Republic of China, First Office Action for CN201510167640.6, dated Dec. 22, 2017.

* cited by examiner

SYSTEM FOR TESTING WIRELESS TERMINAL AND METHOD FOR CONTROLLING THE SAME

CROSS-REFERENCE TO RELATED APPLICATIONS

This application is a U.S. national phase of International Application No. PCT/CN2016/077236, filed with the State Intellectual Property Office of P. R. China on Mar. 24, 2016, the entire content of which is incorporated herein by reference.

FIELD

The present disclosure relates to the field of wireless terminal technology, and more particularly, to a system for testing a wireless terminal and a method for controlling the same.

BACKGROUND

In radiated performance test of a wireless terminal, radiation signals and receiver sensitivities in a plurality of directions are measured, and a total radiated power (TRP for short) and a total isotropic sensitivity (TIS for short) are obtained by mathematical calculation based on the measured data. Since an antenna of a mobile wireless communication terminal is usually not directional, but radiates to all directions of space, when testing wireless performance of the mobile terminal, a basic idea is to put a device under test at a center of a sphere, measure signal strengths at a plurality of positions on surface of the sphere by test antennas, and calculate a total radiated intensity after obtaining measured values of all positions.

At present, according to a test standard of CTIA (Cellular Telecommunications Industry Association), a great circle test method is used mainly. A mobile terminal under test is put on a center of a three dimensional turntable, and may rotate around two axes with the turntable. By using one test antenna and setting both the mobile terminal and the test antenna in an anechoic chamber, the direct signal emitted to the test antenna by the mobile terminal under test is received by the test antenna, and the radiation signals emitted to other directions by the mobile terminal are absorbed by absorbing material set in the anechoic chamber. When testing, the mobile terminal is rotated with a preset angle interval according to a test demand. The mobile terminal is stopped to measure the signal strength when rotated to each position. A test duration may be reduced by adjusting the angle interval. After the radiation signals in all directions are measured, a test result is generated by integration and other data processing accordingly.

However, a test speed of this system is low, and it is needed that a distance between the test antenna and the device under test to be larger than a far field distance to make the device under test irradiated with a plane wave of the test antenna, thus causing a huge volume, a high manufacturing cost, and a small application scope of the test system.

SUMMARY

According to embodiments of the present disclosure, a system for testing a wireless terminal is provided. The wireless terminal is configured as a device under test. The system includes: a reflecting surface, configured to totally reflect one or more first wireless signals emitted by the wireless terminal; a test antenna, configured to receive the one or more first wireless signals reflected by the reflecting surface; and an absorbing screen, configured to absorb one or more second wireless signals emitted by the wireless terminal, in which the one or more second wireless signals are emitted by the wireless terminal toward a direction of the test antenna; in which the device under test, the test antenna and the reflecting surface correspond to a same ellipsoid, the device under test and the test antenna are arranged at two foci of the ellipsoid respectively, the reflecting surface is arranged on the ellipsoidal surface, and the absorbing screen is arranged on a straight line between the device under test and the test antenna.

According to embodiments of the present disclosure, a method for controlling the above system for testing a wireless terminal is provided. The method includes: controlling the wireless terminal to emit wireless signals, in which one or more first wireless signals of the wireless signals reach the reflecting surface and one or more second wireless signals of the wireless signals reach the absorbing screen; receiving the one or more first wireless signals emitted by the wireless terminal and reflected by the reflecting surface; superposing the one or more first wireless signals reflected to the test antenna in phase at the test antenna; and obtaining a wireless performance of the wireless terminal according to a result of superposing in phase.

BRIEF DESCRIPTION OF THE DRAWINGS

Above and/or additional aspects and advantages of the present disclosure will become apparent and more easily to understand from the following descriptions of the embodiments of the present disclosure with reference to the drawings, in which.

DETAILED DESCRIPTION

Figure 1:
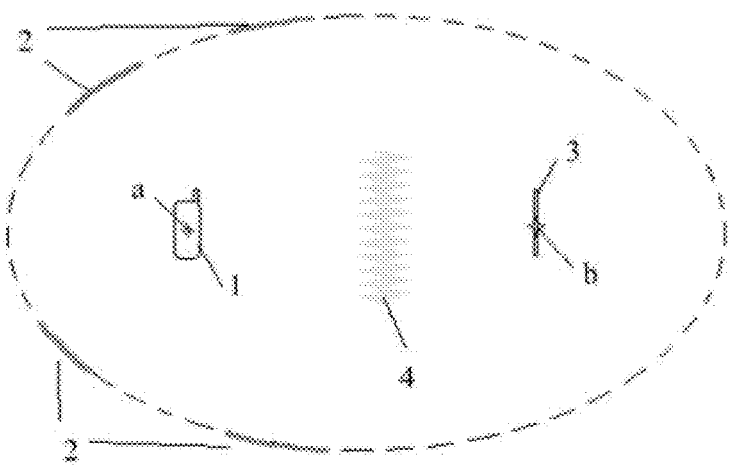
FIG. 1 is a schematic diagram illustrating structure of a system for testing a wireless terminal according to an embodiment of the present disclosure.

Reference will now be made in detail to exemplary embodiments, examples of which are illustrated in the accompanying drawings, wherein the same or similar elements and the elements having same or similar functions are denoted by like reference numerals throughout the descriptions. Embodiments described herein with reference to drawings are explanatory and used to generally understand the present disclosure, and shall not be construed to limit the present disclosure.

The system for testing a wireless terminal and the method for controlling the system for testing a wireless terminal according to embodiments of the present disclosure will be described with reference to drawings.

FIG. 1 is a schematic diagram illustrating structure of a system for testing a wireless terminal according to an embodiment of the present disclosure.

As illustrated in FIG. 1, the system for testing a wireless terminal according to an embodiment of the present disclosure includes a reflecting surface 2, a test antenna 3 and an absorbing screen 4. The device under test 1 of the system may be a wireless terminal.

In an embodiment, a position relationship of the device under test 1, the test antenna 3 and the reflecting surface 2 may correspond to a same ellipsoid, in which the device under test 1 and the test antenna 3 are arranged at two foci a and b of the ellipsoid respectively, and the reflecting surface 2 is arranged on the ellipsoidal surface. The reflecting surface 2 being arranged on the ellipsoidal surface means that the reflecting surface 2 coincides with the ellipsoidal surface at the position where it is arranged.

Figure 2:
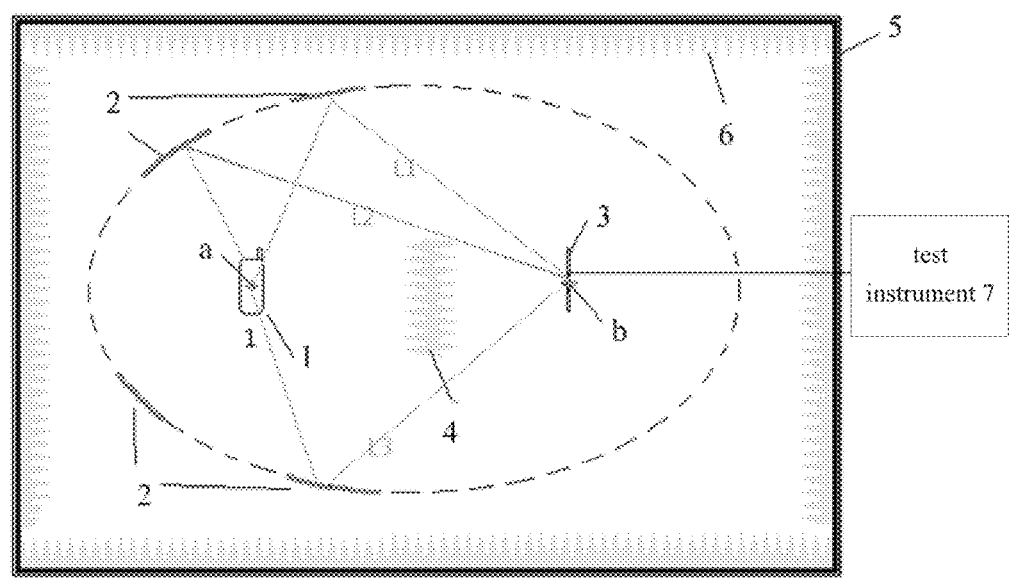
FIG. 2 is a schematic diagram illustrating structure of a system for testing a wireless terminal according to another embodiment of the present disclosure.

In embodiments of the present disclosure, the wireless signal emitted by the wireless terminal 1 may be an electromagnetic wave signal. According to physical principles of ellipsoidal reflection, an electromagnetic wave signal emitted from one focus may be reflected to the other focus by the ellipsoid. And a sum of distances from any point on the ellipsoid to each of the two foci of the ellipsoid is a fixed value. Therefore, the electromagnetic wave signal emitted by the wireless terminal 1 may be reflected to the test antenna 3 by the reflecting surface 2, and propagation path lengths of a plurality of electromagnetic wave signals that are emitted by the wireless terminal 1 and reflected by the reflecting surface 2 to the test antenna 3 are the same. For instance, as illustrated in FIG. 2, the propagation path lengths of three electromagnetic wave signals that are emitted by the wireless terminal 1 and reflected to the test antenna 3 are L1, L2 and L3 respectively, and L1=L2=L3. Thus phase differences of the plurality of electromagnetic wave signals caused by the propagation path are same, and in-phase superposition of the wireless signals received by the test antenna 3 may be achieved.

It should be understood that, in actual test, the ellipsoid is not physically arranged in the system. The ellipsoid is a virtual ellipsoid, which is only used to describe the position relationship among the device under test 1, the test antenna 3 and the reflecting surface 2, so as to clarify the position relationship among those three.

The wireless signal emitted toward a direction of the test antenna 3 from the device under test 1 may be directly emitted to the test antenna 3 without reflection, which may be called as a direct signal. Since the propagation path of the direct signal is different from that of the reflected signal, the phase differences caused by the propagation paths may be different too. Therefore, an effect of offset or partial superposition may be caused by the different phase differences when the direct signal and the reflected signal arrive at the test antenna 3, and objectives such as in-phase superposition and power combining may not be achieved. For this reason, to prevent these influences, in embodiments of the present disclosure, the absorbing screen 4 is arranged at a straight line between the device under test 1 and the test antenna 3, which is configured to absorb radio waves. Thus, the direct signal emitted from the device under test 1 to the test antenna 3 may be absorbed (or blocked) by the absorbing screen 4.

Therefore, the device under test 1 is configured to emit wireless signals. The reflecting surface 2 is configured to totally reflect one or more first wireless signals emitted by the wireless terminal. The test antenna 3 is configured to receive the one or more first wireless signals reflected by the reflecting surface. The absorbing screen 4 is configured to absorb one or more second wireless signals emitted by the wireless terminal, in which the one or more second wireless signals are emitted by the wireless terminal toward a direction of the test antenna. In other words, the second wireless signal is the direct signal.

In an embodiment of the present disclosure, the absorbing screen 4 may be made of wave-absorbing material. In detail, the wave-absorbing material may be a sponge dipped by carbon powder.

Since the direct signal emitted from the device under test 1 to the test antenna 3 is absorbed by the absorbing screen 4, the influence of the direct signal is no longer considered in embodiments of the present disclosure.

In an embodiment of the present disclosure, as illustrated in FIG. 2, the system may further include an anechoic chamber and a test instrument on the basis of FIG. 1.

The anechoic chamber includes a shielding box 5 and wave-absorbing material 6 laid inside the shielding box 5.

A function of the shielding box 5 is to shield electromagnetic interference from outside (such as the anechoic chamber). The wave-absorbing material may be laid on the internal walls of the shielding box 5 and configured to absorb the electromagnetic waves emitted to the internal walls of the shielding box 5, thereby reducing reflection inside the metallic shielding box.

In an embodiment of the present disclosure, the device under test 1, the test antenna 3, the reflecting surface 2 and the absorbing screen 4 are arranged at corresponding positions by a support part made of a nonmetallic material, thus preventing interference and error that may be caused by reflection of the wireless signals because of using a metallic support part.

The test instrument 7 is connected with the test antenna 3, and configured to test the device under test 1 according to the one or more wireless signals received by the test antenna 3.

In detail, the test instrument 7 may perform power combining on the plurality of wireless signals received by the test antenna 3, and test according to a result of the power combining.

Implementation principles of the system for testing a wireless terminal according to embodiments of the present disclosure are illustrated below with reference to FIG. 3 and FIG. 4a to FIG. 4d.

The number and position(s) of the reflecting surface(s) 2 may be selected according to test demand of the device under test 1. In embodiments of the present disclosure, the number of the reflecting surface(s) 2 is at least one, and the position of each of the at least one reflecting surface 2 corresponds to each of at least one radiation direction of main radiation directions of the device under test. In detail, the main radiation direction refers to a radiation direction which has a relatively greater radiated intensity.

Figure 3:
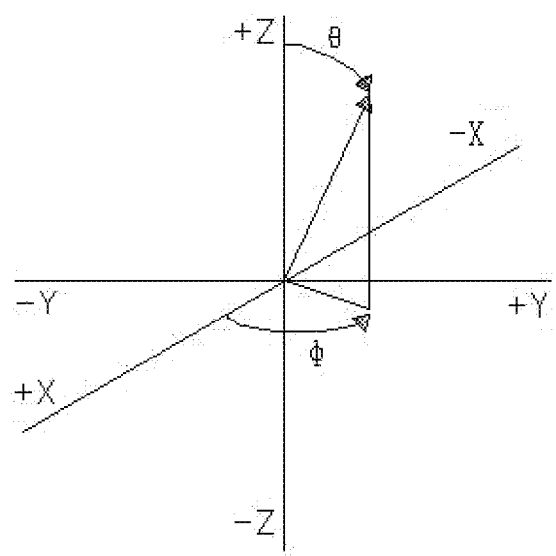
FIG. 3 is a schematic diagram illustrating a reference coordinate system according to embodiments of the present disclosure.

For convenience of description, a reference coordinate system as illustrated in FIG. 3 is utilized, and a mobile phone is taken as an example of the device under test. A direction of a longest side of the mobile phone is taken as a z axis, the positive direction of the z axis is along a top side of the mobile phone; an x axis is perpendicular to a screen of the mobile phone, and a y axis is perpendicular to a plane in which the x axis and the z axis lie. Positive directions of the x axis and the y axis are illustrated as FIG. 3.

For example, according to the test demand, it is to be tested a power sum of radiation signals of three directions of ($\theta=30°$, $\varphi=90°$, ($\theta=30°$, $\varphi=270°$ and ($\theta=150°$, $\varphi=90°$ (as illustrated in FIG. 3, the angle $\theta$ is an angle between a direction of a radiation signal to be tested and the positive direction of the z axis, and the angle φ is an angle between a projection of the direction of the radiation signal to be tested in the XY plane and the positive direction of the x axis), i.e. radiation values in the three directions of (θ=30°, φ=90°, (θ=30°, φ=270° and (θ=150°, φ=90° may be greater than a radiation threshold, then three corresponding reflecting surfaces could be arranged in the three directions of (θ=30°, φ=90°, (θ=30°, φ=270° and (θ=150°, φ=90° respectively. In detail, the reflecting surface has a shape of part of the virtual ellipsoidal surface corresponding to a location of the reflecting surface, and is completely consistent with the virtual ellipsoidal surface when it is arranged at the location.

Under this kind of settings, incident signals in the three directions of (θ=30°, φ=90°, (θ=30°, φ=270° and (θ=150°, φ=90° emitted by the device under test 1 (the mobile phone) located at the focus a are reflected to the test antenna 3 located at the focus b by the reflecting surface, and then are received by the test antenna 3, therefore an output of the test antenna 3 is the power sum of the signals in the three directions. Thus the test instrument 7 may obtain the power sum of the device under test 1 in the three directions of (θ=30°, φ=90°, (θ=30°, φ=270° and (θ=150°, φ=90°.

Therefore, the number and the position(s) of the reflecting surface(s) 2 may be determined according to the test demand. For example, FIGS. 4a to 4d are schematic diagrams illustrating the position(s) of the reflecting surface(s) according to embodiments of the present disclosure.

Figure 4A:
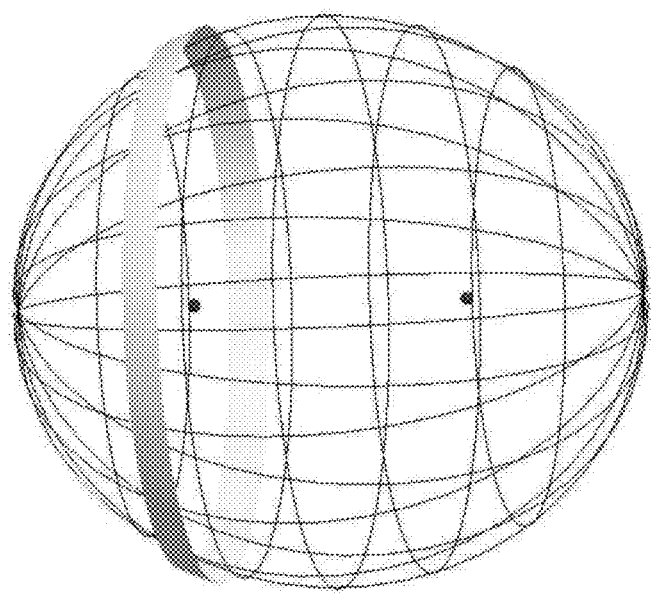
FIGS. 4a to 4d are schematic diagrams illustrating positions of a reflecting surface according to embodiments of the present disclosure.
Figure 4B:
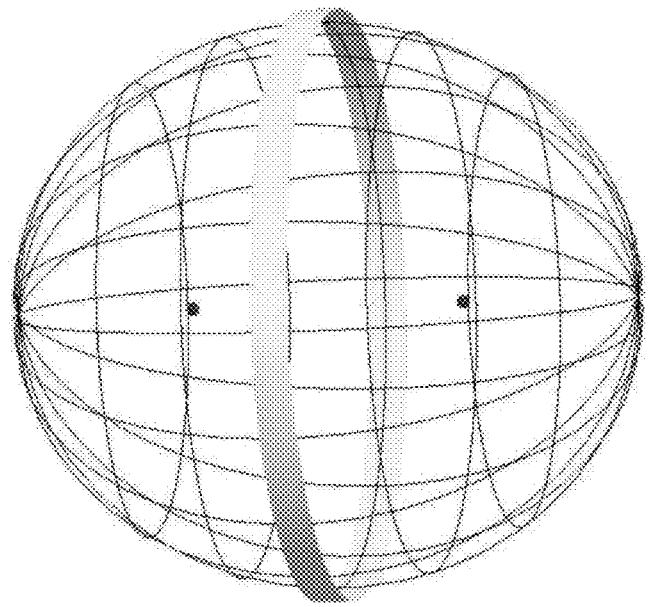

When the wireless signal of each direction of a circle should be tested for a device under test 1 with uniform radiation intensity, the reflecting surface may be set as an annular reflecting surface which located in a plane perpendicular to a line passing through the device under test 1 and the test antenna 3 (i.e. the long axis of the ellipsoid). A position of the annular reflecting surface may be arranged according to the test demand, for example, arranged around the focus at which the device under test 1 is located as illustrated in FIG. 4a, or arranged between the device under test 1 and the test antenna 3 as illustrated in FIG. 4b. Thus the wireless signal in each direction of the circle where the reflecting surface located at may be tested at one time. Compared to a solution that only one or more partial reflecting surfaces are arranged, the device under test 1 does not need to be rotated to make the signal emitted to each direction by the device under test 1 to reflect to the reflecting surface, thus reducing test time, and achieving a fast test.

Figure 4C:
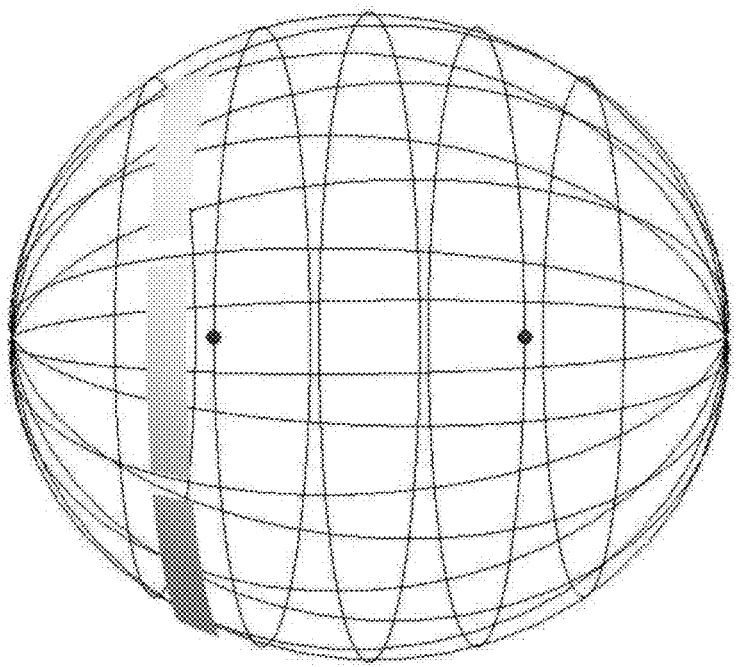
Figure 4D:
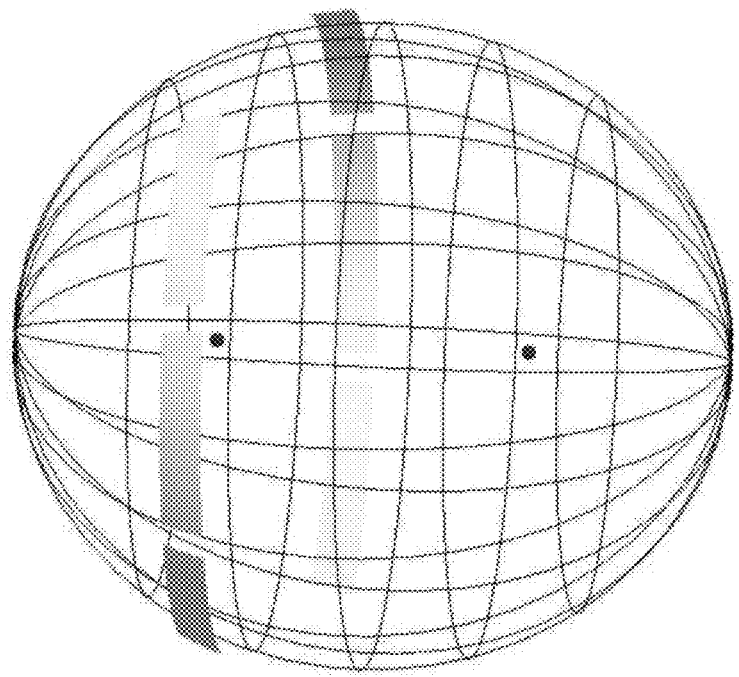

When the wireless signals of the device under test 1 in three or six directions need to be tested, the reflecting surfaces may be arranged at corresponding positions according to the angle θ and the angle φ of each direction. When the wireless signals in three directions need to be tested, three reflecting surfaces may be arranged as illustrated in FIG. 4c, in which the three reflecting surfaces are located around the focus at which the device under test 1 is located, a plane perpendicular to the long axis of the ellipsoid and containing the focus at which the device under test 1 is located intersects the three reflecting surfaces, and the three reflecting surfaces are not opposite to each other. When the wireless signals of the device under test 1 in six directions need to be tested, six reflecting surfaces may be arranged as illustrated in FIG. 4d, three reflecting surfaces of which are the same with that in FIG. 4c, opposite to and in a same plane with the other three reflecting surfaces. The same plane is perpendicular to the long axis of the ellipsoid, and the other three reflecting surfaces are located around the focus at which the device under test 1 is located.

It can be seen that with solutions provided in the present disclosure, based on the test demand of the device under test 1, by converging radiation signals in the plurality of directions of the device under test 1 to the test antenna 3, in-phase superposition and power combining of the radiation signals in the plurality of directions is achieved at the test antenna 3, thus obtaining the power sum of the radiation signals in the plurality of directions at one time. While using the method in the related art, radiation signals in each direction should be measured, and then data processing and power addition are performed to the measuring results.

It should be noted that the device under test 1 is oriented in a direction of the test antenna 3. The wireless signal emitted by the device under test 1 in the direction towards the test antenna 3 may not be measured because of the arranged absorbing screen 4. If the wireless signal in this direction needs to be measured, the wireless signal in the direction towards the test antenna 3 and of the device under test 1 may be turned towards the reflecting surface 2 by rotating the device under test 1, so that the wireless signal may be reflected to the test antenna 3 by the reflecting surface 2 to perform the test.

Since reception and emission of the wireless signal are interchangeable, above descriptions can also be applied in receiving test of the device under test 1 in a similar way, which can be easily understood by those skilled in the art, and will not be described in detail.

With the system for testing a wireless terminal according to embodiments of the present disclosure, the reflecting surface may be arranged according to test demand of the device under test, the wireless signals in a plurality of directions of the device under test are converged to the test antenna by the reflecting surface, and the wireless signals in the plurality of directions may reach in-phase superposition and power combining at the test antenna, thus measuring the power sum of the wireless signals in the plurality of directions at one time. Compared to the manner in the related art, which has to test the wireless signal in each direction and perform data processing and power addition on the test results, with the system according to embodiments of the present disclosure, the test speed is higher, multiple repeated operations are avoided, and the device under test no longer needs to be irradiated in a plane wave of the test antenna, and further, the distance between the device under test and the test antenna may be smaller than the far field distance needed in the related art, thus simplifying structure of the test system, reducing a size of the system, having advantages of a small repeatability error of test results, stable test results, high test efficiency, and low cost, particularly being appropriate for the wireless performance development, production and other aspects of wireless terminals.

In order to implement the above embodiments, embodiments of the present disclosure further provide a method for controlling a system for testing a wireless terminal.

Figure 5:
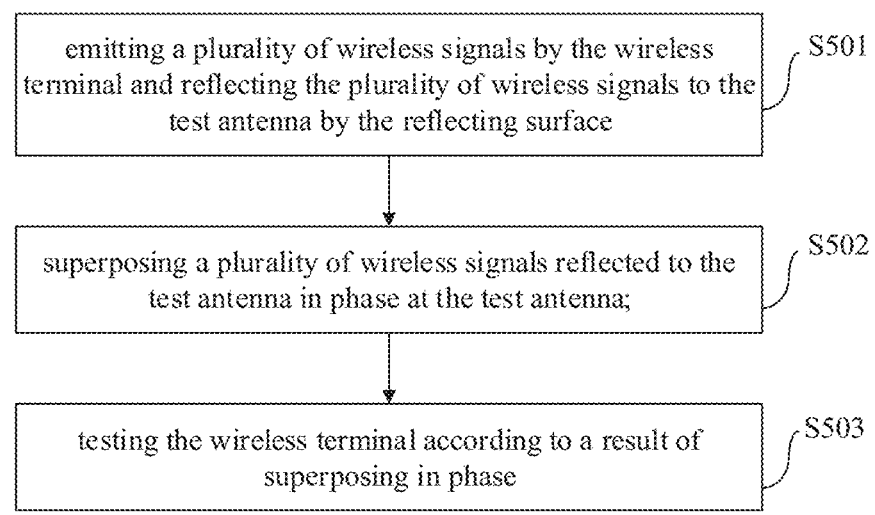
FIG. 5 is a flow chart of a method for controlling a system for testing a wireless terminal according to an embodiment of the present disclosure.

FIG. 5 is a flow chart of a method for controlling a system for testing a wireless terminal according to an embodiment of the present disclosure.

The system for testing a wireless terminal includes: a wireless terminal, a test antenna configured to receive one or more wireless signals, a reflecting surface configured to totally reflect one or more wireless signals emitted by the wireless terminal, and an absorbing screen configured to absorb a radio wave. The device under test and the test antenna are arranged at two foci of an ellipsoid respectively, the reflecting surface is arranged on the same ellipsoidal surface, and the absorbing screen is arranged on a straight line between the device under test and the test antenna. Details may be referred in embodiments with reference to FIG. 1 and FIG. 2.

As illustrated in FIG. 5, the method for controlling a system for testing a wireless terminal according to an embodiment of the present disclosure includes followings.

At block 501, a plurality of wireless signals are emitted by the wireless terminal and reflected to the test antenna by the reflecting surface.

In block 5502, a plurality of wireless signals reflected to the test antenna are superposed in phase at the test antenna.

In block 5503, the wireless terminal is tested according to a result of superposing in phase.

Specifically, the wireless terminal may be tested by a test instrument according to the result of superposing in phase of the plurality of wireless signals reflected to the test antenna.

In embodiments of the present disclosure, the wireless signal emitted by the wireless terminal may be an electromagnetic wave signal. According to physical principles of ellipsoidal reflection, an electromagnetic wave signal emitted from one focus may be reflected to the other focus by the ellipsoid. And a sum of distances from any point on the ellipsoid to each of the two foci of the ellipsoid is a fixed value. Therefore, the electromagnetic wave signal emitted by the wireless terminal may be reflected to the test antenna by the reflecting surface, and propagation path lengths of a plurality of electromagnetic wave signals that are emitted by the wireless terminal and reflected by the reflecting surface to the test antenna are the same. For instance, as illustrated in FIG. 2, the propagation path lengths of three electromagnetic wave signals that are emitted by the wireless terminal and reflected to the test antenna are L1, L2 and L3 respectively, and L1=L2=L3. Thus phase differences of the plurality of electromagnetic wave signals caused by the propagation path are same, and in-phase superposition of the wireless signals received by the test antenna may be achieved.

It should be understood that, in actual test, the ellipsoid is not physically arranged in the system. The ellipsoid is a virtual ellipsoid, which is only used to describe the position relationship among the device under test, the test antenna and the reflecting surface, so as to clarify the position relationship among the three.

The wireless signal emitted toward a direction of the test antenna from the device under test may be directly emitted to the test antenna without reflection, which may be called as a direct signal. Since the propagation path of the direct signal is different from that of the reflected signal, the phase differences caused by the propagation paths may be different too. Therefore, an effect of offset or partial superposition may be caused by the different phase differences when the direct signal and the reflected signal arrive at the test antenna, and objectives such as in-phase superposition and power combining may not be achieved. For this reason, to prevent these influences, in embodiments of the present disclosure, the absorbing screen is arranged at a straight line between the device under test and the test antenna, which is configured to absorb radio waves. Thus, the direct signal emitted from the device under test to the test antenna may be absorbed (or blocked) by the absorbing screen.

In an embodiment of the present disclosure, the absorbing screen may be made of wave-absorbing material. In detail, the wave-absorbing material may be a sponge dipped by carbon powder.

Since the direct signal emitted from the device under test to the test antenna is absorbed by the absorbing screen, the influence of the direct signal is no longer considered in embodiments of the present disclosure.

In an embodiment of the present disclosure, the device under test, the test antenna, the reflecting surface and the absorbing screen are arranged at corresponding positions by a support part made of a nonmetallic material, thus preventing interference and error that may be caused by reflection of the wireless signals because of using a metallic support part.

In detail, implementation principles of the system for testing a wireless terminal according to embodiments of the present disclosure may be found in embodiments described with reference to FIG. 3 and FIG. 4a to FIG. 4d, thus being elaborated here.

With the method for controlling a system for testing a wireless terminal according to embodiments of the present disclosure, the reflecting surface may be arranged according to test demand of the device under test, the wireless signals in a plurality of directions of the device under test are converged to the test antenna by the reflecting surface, and the wireless signals in the plurality of directions may reach in-phase superposition and power combining at the test antenna, thus measuring the power sum of the wireless signals in the plurality of directions at one time. Compared to the manner in the related art, which has to test the wireless signal in each direction and perform data processing and power addition on the test results, with the method according to embodiments of the present disclosure, the test speed is higher, multiple repeated operations are avoided, and the device under test no longer needs to be irradiated in a plane wave of the test antenna, and further, the distance between the device under test and the test antenna may be smaller than the far field distance needed in the related art, thus simplifying structure of the test system, reducing a size of the system, having advantages of a small repeatability error of test results, stable test results, high test efficiency, and low cost, particularly being appropriate for the wireless performance development, production and other aspects of wireless terminals.

In the specification, it is to be understood that terms such as "central," "longitudinal," "lateral," "length," "width," "thickness," "upper," "lower," "front," "rear," "left," "right," "vertical," "horizontal," "top," "bottom," "inner," "outer," "clockwise," "counterclockwise," "axial," "radial," and "circumference" should be construed to refer to the orientation as then described or as shown in the drawings under discussion. These relative terms are for convenience of description and do not require that the present invention be constructed or operated in a particular orientation.

In addition, terms such as "first" and "second" are used herein only for purposes of description and are not intended to indicate or imply relative importance or significance or to imply the number of indicated technical features. Thus, the feature defined with "first" and "second" may comprise one or more of this feature either in a way of imply or indicate. In the description of the present disclosure, "a plurality of" means two or more than two, for example, two, three, etc., unless specifically and particularly prescribed otherwise.

In the present invention, unless specified or limited otherwise, the terms "mounted", "connected", "coupled", "fixed" and the like are used broadly, and may be, for example, fixed connections, detachable connections, or integral connections; may also be mechanical or electrical connections; may be direct connections or indirect connections via intervening structures; may also be inner communications of two elements, or interactions of two elements, unless specified otherwise. The particular meanings of above terms can be understood by those skilled in the art according to specific situations.

In the present invention, unless specified or limited otherwise, a structure in which a first feature is "on" or "below" a second feature may include an embodiment in which the first feature is in direct contact with the second feature, and may also include an embodiment in which the first feature and the second feature are not in direct contact with each other, but are contacted via an additional feature formed therebetween. Furthermore, a first feature "on," "above," or "on top of" a second feature may include an embodiment in which the first feature is right or obliquely "on," "above," or "on top of" the second feature, or just means that the first feature is at a height higher than that of the second feature. While a first feature "below," "under," or "on bottom of" a second feature may include an embodiment in which the first feature is right or obliquely "below," "under," or "on bottom of" the second feature, or just means that the first feature is at a height lower than that of the second feature.

Reference throughout this specification to "an embodiment", "some embodiments", "an example", "a specific example", or "some examples" means that a particular feature, structure, material, or characteristic described in connection with the embodiment or example is included in at least one embodiment or example of the present disclosure. In this specification, exemplary descriptions of aforesaid terms are not necessarily referring to the same embodiment or example. Furthermore, the particular features, structures, materials, or characteristics may be combined in any suitable manner in one or more embodiments or examples. In addition, those skilled in the art could combine or associate different embodiments, examples or characters of different embodiments or examples, as long as there are no contradictories.

Although embodiments of present disclosure have been shown and described above, it should be understood that above embodiments are just explanatory, and cannot be construed to limit the present disclosure, for those skilled in the art, changes, alternatives, and modifications can be made in the embodiments without departing from spirit, principles, and scope of the present disclosure.

What is claimed is:

1. A system for testing a wireless terminal, wherein the wireless terminal is configured as a device under test and the system comprises:
   a reflecting surface, configured to totally reflect one or more first wireless signals emitted by the wireless terminal;
   a test antenna, configured to receive the one or more first wireless signals reflected by the reflecting surface; and
   an absorbing screen, configured to absorb one or more second wireless signals emitted by the wireless terminal, wherein the one or more second wireless signals are emitted by the wireless terminal toward a direction of the test antenna;
   an anechoic chamber, wherein the device under test, the test antenna, the reflecting surface, and the absorbing screen are arranged in the anechoic chamber, and the anechoic chamber comprises a shielding box and a wave-absorbing material laid inside the shielding box;
   wherein the device under test, the test antenna and the reflecting surface correspond to a same ellipsoid, the device under test and the test antenna are arranged at two foci of the ellipsoid respectively, the reflecting surface is arranged on the ellipsoid, and the absorbing screen is arranged on a straight line between the device under test and the test antenna;
   wherein the system is configured to measure directional radiation from the wireless terminal that exceeds a radiation threshold.

2. The system according to claim 1, wherein, the reflecting surface is an annular reflecting surface, and a plane where the annular reflecting surface is located is perpendicular to a straight line between the device under test and the test antenna.

3. The system according to claim 1, further comprising:
   a test instrument, connected with the test antenna, and configured to test the device under test according to the one or more wireless signals received by the test antenna.

4. The system according to claim 1, wherein, the absorbing screen is made of a wave-absorbing material.

5. The system according to claim 4, wherein, the wave-absorbing material is a sponge dipped by carbon powder.

6. The system according to claim 1, wherein, the device under test, the test antenna, the reflecting surface and the absorbing screen are arranged at corresponding positions by a support part made of a nonmetallic material.

7. The system according to claim 1, wherein, the number of the reflecting surfaces is at least one, and a position of each of the at least one reflecting surface corresponds to each of at least one radiation direction of main radiation directions of the device under test.

8. The system according to claim 7, wherein, the number of the reflecting surfaces is 3 or 6.

9. A method for controlling a system for testing a wireless terminal, wherein, the wireless terminal is configured as a device under test; the system for testing the wireless terminal comprises: a reflecting surface configured to totally reflect one or more first wireless signals emitted by the wireless terminal, a test antenna configured to receive the one or more first wireless signals reflected by the reflecting surface, an anechoic chamber, wherein the device under test, the test antenna, the reflecting surface, and the absorbing screen are arranged in the anechoic chamber, and the anechoic chamber comprises a shielding box and wave-absorbing material laid inside the shielding box, and an absorbing screen configured to absorb one or more second wireless signals emitted by the wireless terminal, in which the one or more second wireless signals are emitted by the wireless terminal toward a direction of the test antenna; the device under test and the test antenna are arranged at two foci of an ellipsoid respectively, the reflecting surface is arranged on the same ellipsoid, and the absorbing screen is arranged on a straight line between the device under test and the test antenna; and the method comprises:
   controlling the wireless terminal to emit wireless signals, wherein one or more first wireless signals of the wireless signals reach the reflecting surface and one or more second wireless signals of the wireless signals reach the absorbing screen;
   receiving the one or more first wireless signals emitted by the wireless terminal and reflected by the reflecting surface;
   superposing the one or more first wireless signals reflected to the test antenna in phase at the test antenna; and
   obtaining a wireless performance of the wireless terminal according to a result of superposing in phase, the wireless performance including a directional radiation measurement from the wireless terminal that exceeds a radiation threshold.

10. The method according to claim 9, wherein, the reflecting surface is an annular reflecting surface, and a plane where the annular reflecting surface is located is perpendicular to a straight line between the device under test and the test antenna.

11. The method according to claim 9, wherein, the system further comprises:
   a test instrument, connected with the test antenna, and configured to test the device under test according to the one or more wireless signals received by the test antenna.

12. The method according to claim 9, wherein, the absorbing screen is made of wave-absorbing material.

13. The method according to claim 12, wherein, the wave-absorbing material is a sponge dipped by carbon powder.

14. The method according to claim 9, wherein, the device under test, the test antenna, the reflecting surface and the absorbing screen are arranged at corresponding positions by a support part made of a nonmetallic material.

15. The method according to claim 9, wherein, the number of the reflecting surfaces is at least one, and a position of each of the at least one reflecting surface corresponds to each of at least one radiation direction of main radiation directions of the device under test.

16. The method according to claim 15, wherein, the number of the reflecting surfaces is 3 or 6.

* * * * *